US006518362B1

(12) United States Patent
Clough et al.

(10) Patent No.: US 6,518,362 B1
(45) Date of Patent: Feb. 11, 2003

(54) MELT BLENDING POLYPHENYLENE ETHER, POLYSTYRENE AND CURABLE EPOXY

(75) Inventors: Robert Steven Clough, St. Paul, MN (US); Mario Alberto Perez, Burnsville, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 569 days.

(21) Appl. No.: 09/025,400

(22) Filed: Feb. 18, 1998

(51) Int. Cl.$^7$ .................. C08L 63/00; C08L 63/02; C08L 25/06; C08L 71/12
(52) U.S. Cl. .................. 525/109; 525/65; 525/108
(58) Field of Search .................. 525/109, 65, 108

(56) References Cited

U.S. PATENT DOCUMENTS

| | | | |
|---|---|---|---|
| 4,054,553 A | 10/1977 | Olander | 260/47 |
| 4,092,294 A | 5/1978 | Bennett, Jr. et al. | 260/47 |
| 4,250,053 A | 2/1981 | Smith | 252/426 |
| 4,256,828 A | 3/1981 | Smith | 430/280 |
| 4,477,649 A | 10/1984 | Mobley | 528/212 |
| 4,477,651 A | 10/1984 | White | 528/215 |
| 4,517,341 A | 5/1985 | White | 525/152 |
| 4,684,678 A | 8/1987 | Schultz et al. | 523/466 |
| 4,912,172 A | 3/1990 | Hallgren et al. | 525/396 |
| 5,001,010 A * | 3/1991 | Chao et al. | 525/396 |
| 5,006,610 A * | 4/1991 | Nakamura et al. | 525/396 |
| 5,059,701 A | 10/1991 | Keipert | 556/13 |
| 5,191,101 A | 3/1993 | Palazzotto et al. | 556/47 |
| 5,256,694 A | 10/1993 | Wuest | 514/549 |
| 5,256,828 A | 10/1993 | Cuscurida et al. | 568/620 |
| 5,308,565 A | 5/1994 | Weber et al. | 264/112 |
| 5,457,149 A | 10/1995 | Hall et al. | 25/523 |
| 5,709,948 A | 1/1998 | Perez et al. | 428/413 |

FOREIGN PATENT DOCUMENTS

| | | |
|---|---|---|
| EP | 137545 | 4/1985 |
| EP | 400321 | 5/1990 |
| EP | 421337 | 4/1991 |
| EP | 592145 | 4/1994 |

OTHER PUBLICATIONS

Venderbosch, Nelissen, Meijer and Lemstra, Makromol. Chem., Macromol. Symp. 75, p. 73–84 (1993).

Venderbosch, Meijer and Lemstra, Polymer, vol. 35. No. 20, p. 4349–4357 (1994).

Venderbosch, Meijer and Lemstra, Polymer, vol. 36, No. 6, p 1167–1178 (1995).

Van der Sanden, Meijer, Lemstra, Progress in Colloid & Polymer Science, *The ultimate toughness of polymers. The influence of network and microscopic structure*, vol. 92, p 120–128 (1993).

Yamanaka, Inoue, Polymer, *Structure development in epoxy resin modified with poly(ether sulphone)* vol. 30, Apr. (1989).

Sefton, McGrail, Peacock, Wilkinson, Crick, Davies, Almen, Semi–Interpenetrating Polymer Networks as a Route to Toughening of Epoxy Resin Matrix Composites, 19$^{th}$ International SAMPE Technical Conference, Oct. 13—15, (1998).

Pearson, R. A. et al; "The Preparation and Morphology of PPO–epoxy Blends", Journal of Applied Polymer Science, vol. 48, No. 6, May 10, 1993, p. 1051–1060, XP000462304.

\* cited by examiner

Primary Examiner—Robert E. L. Sellers
(74) Attorney, Agent, or Firm—Philip Y. Dahl

(57) ABSTRACT

A curable melt blended composition and a method of making the composition by melt blending a thermoplastic polymer comprising polyphenylene ether (PPE) polymer and a polystyrene polymer, preferably high impact polystyrene (HIPS), and optionally a compatiblizer, with an uncured epoxy component, comprising a curable epoxy and an epoxy curing agent, at a temperature greater than 150° C. and without addition of solvent wherein the epoxy component of the resulting curable melt blended composition remains substantially uncured.

9 Claims, 1 Drawing Sheet

MELT BLENDING POLYPHENYLENE ETHER, POLYSTYRENE AND CURABLE EPOXY

FIELD OF THE INVENTION

This invention relates to methods for making curable melt processed materials comprising mixtures of polyphenylene ether (PPE) and polystyrene (PS), particularly high impact polystyrene (HIPS), with uncured epoxy components which comprise a curable epoxy and an epoxy curing agent, curable materials made by this method, and materials resulting from the subsequent cure of those materials.

BACKGROUND OF THE INVENTION

It is a common practice in the industry to blend a small amount of elastomeric or thermoplastic material into a hard thermosetting resin in order to toughen (i.e., increase the ductility of) the thermoset. Elastomeric or thermoplastic toughening agents include natural rubbers, polyolefins, and vinyl copolymers such as poly(styrene-co-butadiene). In such cases, the toughening agent is blended in a ratio of from about 1:20 to about 1:4 with a curable thermosetting resin such that the thermoplastic component becomes the dispersed phase in a thermosetting resin continuous phase.

U.S. Pat. No. 5,709,948 discloses curable mixtures of polyolefin resins and epoxies. Curable mixtures comprising PPEs are not disclosed.

EP 592,145 and U.S. Pat. No. 4,912,172 disclose curable compositions consisting essentially of a polyphenylene ether (PPE), an epoxy, a zinc or aluminum catalyst, and, in some cases, an imide co-catalyst. These references do not teach that a curable melt processed composition of greater than 50% thermoplastic can be obtained. These references disclose solvent mixing of the components or mixing wherein a liquid epoxy is the major component. These references do not teach the use of a PPE/HIPS blend thermoplastic. These references disclose materials for structural use rather than for use as adhesives or coatings.

U.S. Pat. No. 5,001,010 discloses a curable article comprising a mixture of an epoxy and an epoxy cure catalyst with a specific PPE obtained by melt processing the PPE at 230° C.–290° C. prior to addition of epoxy. This reference discloses solvent mixing of the epoxy with the melt-processed PPE and subsequent cure at 190° C.–250° C.

U.S. Pat. No. 5,308,565 discloses a prepreg board made with reinforcing fiber and a curable composition which preferably comprises PPE, a liquid epoxy, a flame retardant, and a curing catalyst, but at least comprising the first two elements. The blend is partially cured during mixing ('565 at col. 2, ln. 50) at 100–130° C., so that it can be granulated and mixed with a substrate for final curing to form a mat. The reference emphasizes throughout that the mixing is performed at 100–130° C. The reference recommends an epoxy content of greater than 50%. ('565 at col. 13, ln. 31). This reference discloses materials for structural use rather than for use as adhesives or coatings.

EP 137,545 discloses an article made from a blend of PPE, HIPS and an epoxy resin which is coated with a lacquer or adhesive. The material of the reference is required to receive a coating or adhesive and is not disclosed as being suitable for use as a coating or adhesive. The reference does not teach that the epoxy component is cured or uncured at any point. The reference does not teach curing the epoxy component or the inclusion of any curative or catalyst.

Venderbosch, Nelissen, Meijer and Lemstra, Makromol.Chem., Macromol. Symp. 75, pp. 73–84 (1993); Venderbosch, Meijer and Lemstra, POLYMER, Vol. 35, no. 20, pp. 4349–4357 (1994); and Venderbosch, Meijer and Lemstra, POLYMER, Vol. 36, no. 6, pp. 1167–1178 (1995) disclose melt mixing combinations of PPE and epoxy monomers. These references do not describe PPE/PS/epoxy mixtures nor the use of compatiblizers with such mixtures.

SUMMARY OF THE INVENTION

Briefly, the present invention provides a method of making a curable melt blended composition by melt blending 60 to 99.9 weight percent of a thermoplastic component, comprising 1–99 weight percent of polyphenylene ether (PPE) polymer, and 1–99 weight percent of polystyrene polymer, preferably high impact polystyrene (HIPS) polymer; and 0.1 to 40 weight percent of an uncured epoxy component, comprising a curable epoxy and an effective amount of a curing agent for said curable epoxy, where melt blending occurs at a temperature greater than 150° C. and is achieved without addition of solvent and the epoxy component of the resulting composition is substantially uncured.

In another aspect, the present invention provides a curable melt blended composition comprising 60 to 99.9 weight percent of a thermoplastic component, comprising 1–99 weight percent of polyphenylene ether (PPE) polymer, and 1–99 weight percent of polystyrene polymer, preferably high impact polystyrene (HIPS) polymer; and 0.1 to 40 weight percent of an uncured epoxy component, comprising a curable epoxy and an effective amount of a curing agent for said curable epoxy, wherein the epoxy component of the resulting composition is substantially uncured.

In another aspect, the present invention provides a cured material resulting from the heat or light cure of the curable melt blended composition provided herein.

In another aspect, the present invention provides an adhesive or coating comprising the curable melt blended composition provided herein or the cured material resulting from the heat or light cure of the curable melt blended composition provided herein.

What has not been described in the art, and is provided by the present invention, is a curable melt processed composition of PPE/polystyrene, epoxy and an epoxy curative, and, optionally, a compatibilizer, wherein the thermoplastic is the major component. In particular, the art does not disclose or teach the method, or the resulting material, wherein PPE/PS, epoxy and epoxy curing agent and, optionally, a compatibilizer, are combined by melt processing, without solvent, at greater than 150° C., to result in a curable composition wherein the epoxy component remains substantially uncured. Furthermore, the art does not disclose or anticipate the improved peel and overlap shear strengths exhibited by the PPE/PS/epoxy blends relative to PPE/epoxy blends.

In this application:

"curing agent", for epoxy, means an epoxy curative or an epoxy catalyst;

"does not substantially heat cure", used in regard to a composition containing an epoxy component, means remains substantially uncured, "substantially uncured" means at least half of the reactive sites for polymerization in a population of monomeric units remain unreacted, preferably more than about 90% remain unreacted and most preferably more than about 95% remain unreacted, and "substituted" means substituted by conventional substituents which do not interfere with the desired product, e.g., substituents can be alkyl, alkoxy, aryl, phenyl, halo (F, Cl, Br, I), cyano, nitro, etc.

It is an advantage of the present invention to provide a method for making materials which exhibit improved peel strength, shear strength and modulus at high temperatures. It is a further advantage to provide such a material in a curable state, which may be applied as an adhesive or coating before cure. It is a further advantage to provide such material which is suitable for uses as an adhesive in electronics applications.

DETAILED DESCRIPTION OF PREFERRED EMBODIMENT

Figure 1:
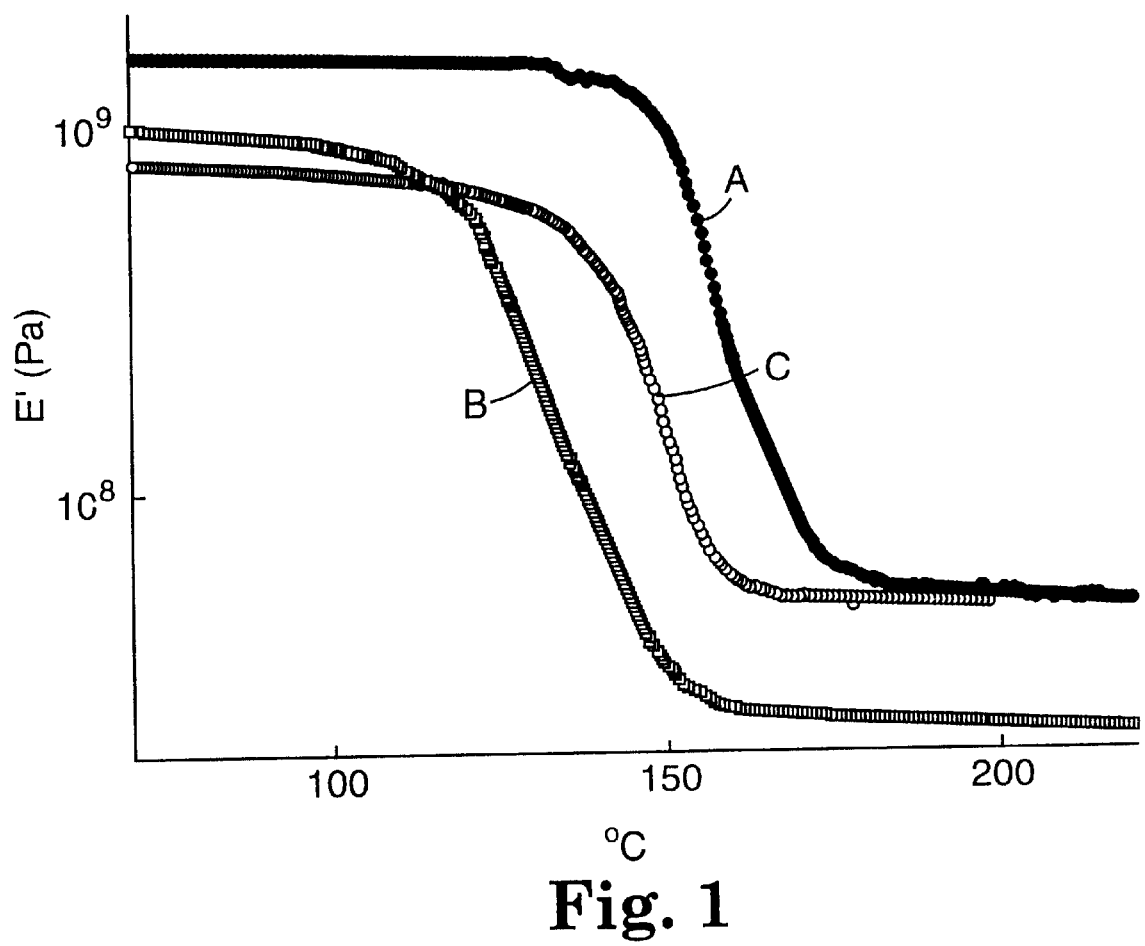
FIG. 1 is a plot of storage modulus versus temperature obtained by dynamic mechanical analysis of a material of the present invention, in cured (A) and uncured (B) state, and a comparative example (C).

The present invention provides a curable melt blended composition comprising 60 to 99.9 weight percent of a thermoplastic polymer comprising 1–99 weight percent of polyphenylene ether (PPE) polymer and 1–99 weight percent of polystyrene polymer, preferably high impact polystyrene (HIPS) polymer; and 0.1 to 40 weight percent of an uncured epoxy component comprising a curable epoxy and an effective amount of curing agent for the epoxy, wherein the epoxy component of the composition is substantially uncured.

The thermoplastic component includes 1–99% by weight of a polyphenylene ether polymer (PPE). The polyphenylene ethers (also known as polyphenylene oxides or PPOs) used in the present invention are a well-known class of polymers. They are widely used in industry, especially as engineering plastics in applications requiring toughness and heat resistance.

The polyphenylene ethers comprise a plurality of structural units having the formula:

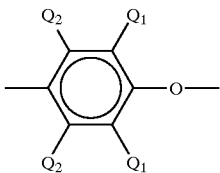

In each of said units independently, each $Q^1$ is independently halogen, primary or secondary lower alkyl (i.e., alkyl containing up to 7 carbon atoms), phenyl, haloalkyl, aminoalkyl, hydrocarbonoxy, or halohydrocarbonoxy wherein at least two carbon atoms separate the halogen and oxygen atoms; and each $Q^2$ is independently hydrogen, halogen, primary or secondary lower alkyl, phenyl, haloalkyl, hydrocarbonoxy or halohydrocarbonoxy as defined for $Q^1$. Examples of suitable primary lower alkyl groups are methyl, ethyl, n-propyl, n-butyl, isobutyl, n-amyl, isoamyl, 2-methylbutyl, n-hexyl, 2,3-dimethylbutyl, 2-,3- or 4-methylpentyl and the corresponding heptyl groups. Examples of secondary lower alkyl groups are isopropyl, sec-butyl and 3-pentyl. Preferably, any alkyl radicals are straight chain rather than branched. Most often, each $Q^1$ is alkyl or phenyl, especially $C_{1-4}$ alkyl, and each $Q^2$ is hydrogen.

Both homopolymer and copolymer polyphenylene ethers are within the purview of the process of the present invention. Suitable homopolymers are those containing, for example, 2,6-dimethyl-1,4-phenylene ether units. Suitable copolymers include random copolymers containing such units in combination with, for example, 2,3,6-trimethyl-1, 4-phenylene ether units. Many suitable random copolymers, as well as homopolymers, are disclosed in the patent literature. Reference is made to U.S. Pat. Nos. 4,054,553, 4,092, 294, 4,477,649, 4,477,651 and 4,517,341, the disclosures of which are incorporated by reference herein.

A preferred PPE, poly(2,6-dimethylphenylene oxide), is available under the trade name Blendex™ HPP820 from General Electric Co., Pitsfield, Mass.

The thermoplastic component may include 1–99% by weight of a polystyrene polymer, but preferably 1–90% and more preferably 10–90% by weight. Polystyrene polymers are well known in the art. The polystyrene may optionally be substituted at any available position. Preferably, the polystyrene polymer is a high impact polystyrene polymer (HIPS). Thermoplastic high impact polystyrene polymers (HIPS) are well known in the art, as are PPE/HIPS blends. Preferred PPE/HIPS blends are available from General Electric Co., Pitsfield, Mass., under the trade name Noryl™. It is believed that Noryl™ EN185 comprises approximately 10% PPE and 90% HIPS and Noryl™ SE1X comprises approximately 50% PPE and 50% HIPS. The $T_g$ and heat deflection temperature (HDT) of PPE/HIPS blends are determined by the relative amount of PPE to HIPS, with $T_g$ and HDT increasing in proportion to PPE content. Noryl™ EN185, Noryl™ SE1X, and Blendex™ HPP820 have HDT's (at 264 psi) of 82, 118, and 182° C., respectively.

The thermoplastic component may optionally include greater than 0% by weight to about 25% by weight, preferably 1–15% and more preferably 1–10% by weight, of a functionalized polystyrene as a compatiblizer for the thermoplastic and epoxy components and to promote adhesion of the cured composition to a substrate. The functionalized polystyrene can be mixed with the thermoplastic polymer blend prior to mixing with the epoxy or can be added during melt blending of the thermoplastic and epoxy.

Suitable functionalized polystyrenes are polystyrenes that have additional chemical functionality, obtained through either copolymerization of styrene monomer with a functional monomer or graft copolymerization subsequent to styrene polymerization. Typically, such functionalized groups include O, N, S, P, or halogen heteroatoms. Reactive functionalized groups include carboxylic acid, hydroxyl, amide, nitrile, carboxylic acid anhydride, epoxide, or halogen groups. Many functionalized polystyrenes are available commercially, such as styrene-maleic anhydride (SMA) copolymers, styrene-acrylonitrile (SAN) copolymers, and copolymers of styrene with, e.g. N-alkyl or N-aryl maleimides, such as N-phenyl maleimide; fumaronitrile or maleonitrile; and methyl methacrylate. Commercially available SMA copolymers include the Dylark™ family, such as Dylark™ 332 (Nova Chemicals, Sarnia, Ontario, Canada), the Cadon™ family, such as Cadon™ 135 (Bayer Corp., Pittsburgh, Pa.), and the Sapron™ S family, such as Sapron™ SM 300 (DSM Engineering Plastics North America, Northbrook, Ill.). Commercially available SAN copolymers include Luran™ polymers (BASF Corp., Plastic Materials, Mt. Olive, N.J.). Any functionalized block copolymers comprising styrene can be useful as compatibilizers in the present invention, including, for example, maleated Kraton™ polymers (Shell Chemical Co., Houston, Tex.).

The blend comprises 0.1–40% by weight, but preferably 1–30% and more preferably 1–20% by weight, of an epoxy component comprising a thermosettable epoxy resin. The thermosettable epoxy resins of the invention preferably comprise compounds which contain one or more 1,2-, 1,3- and 1,4-cyclic ethers, which also may be known as 1,2-, 1,3- and 1,4-epoxides. The 1,2-cyclic ethers are preferred. Such compounds can be saturated or unsaturated, aliphatic, alicyclic, aromatic or heterocyclic, or can comprise combinations thereof. Compounds that contain more than one epoxy group (i.e., polyepoxides) are preferred.

Aromatic polyepoxides (i.e., compounds containing at least one aromatic ring structure, e.g., a benzene ring, and more than one epoxy group) that can be used in the present invention include the polyglycidyl ethers of polyhydric phenols, such as Bisphenol A-type resins and their derivatives, epoxy cresol-novolac resins, Bisphenol-F resins and their derivatives, and epoxy phenol-novolac resins; and glycidyl esters of aromatic carboxylic acids, e.g., phthalic acid diglycidyl ester, isophthalic acid diglycidyl ester, trimellitic anhydride trigylcidyl ester, and pyromellitic acid tetraglycidyl ester, and mixtures thereof. Preferred aromatic polyepoxides are the polyglycidyl ethers of polyhydric phenols, such as the EPON™ series of diglycidyl ethers of Bisphenol-A, including EPON 828 and EPON 1001F, available commercially from Shell Chemicals, Inc., Houston, Tex.

Representative aliphatic cyclic polyepoxides (i.e., cyclic compounds containing one or more saturated carbocyclic rings and more than one epoxy group, also known as alicyclic compounds) useful in the present invention include the "ERL™" series of alicyclic epoxides commercially available from Union Carbide Corp., Danbury, Conn., such as vinyl cyclohexene dioxide (ERL-4206), 3,4-epoxycyclohexylmethyl-3,4-epoxycyclohexane carboxylate (ERL-4221), 3,4-epoxy-6-methylcyclohexylmethyl-3,4-epoxy-6-methylcyclohexane carboxylate (ERL-4201), bis (3,4-epoxy-6-methylcycylohexylmethyl)adipate (ERL-4289), dipentene dioxide (ERL-4269), as well as 2-(3,4-epoxycyclohexyl-5,1"-spiro-3",4"-epoxycyclohexane-1,3-dioxane, 4-(1,2-epoxyethyl)-1,2-epoxycyclohexane and 2,2-bis(3,4-epoxycyclohexyl)propane. Preferred alicyclic polyepoxides are the ERL™ series.

Representative aliphatic polyepoxides (i.e., compounds containing no carbocyclic rings and more than one epoxy group) include 1,4-bis(2,3-epoxypropoxy)butane, polyglycidyl ethers of aliphatic polyols such as glycerol, polypropylene glycol, 1,4-butanediol, and the like, and the diglycidyl ester of linoleic dimer acid.

A wide variety of commercial epoxy resins are available and are listed or described in, e.g., the *Handbook of Epoxy Resins*, by Lee and Neville, McGraw-Hill Book Co., New York (1967), *Epoxy Resins, Chemistry and Technology*, Second Edition, C. May, ed., Marcell Decker, Inc., New York (1988), and *Epoxy Resin Technology*, P. F. Bruins, ed., Interscience Publishers, New York, (1968). Any of the epoxy resins described therein may be useful in preparation of the materials of the present invention.

Suitable curatives or catalysts should tolerate the melt processing step according to the present invention without substantially curing the epoxy component, while retaining the ability to cure the epoxy component at a later time under the influence of heat or light. More specifically, the epoxy should remain substantially uncured after exposure to the temperature present in the melt processing step for the duration of the melt processing step. Other factors that influence catalyst selection include the thickness of the film to be cured, transparency of the film to curing radiation, and the film's end use (for example, when the final use of the film occurs after orientation or stretching, use of a thermal catalyst may not be appropriate, since the thermal activation may compromise the degree of orientation or the structural integrity of the stretched film). Subject to these limitations, suitable curatives may be selected from any known catalysts.

Curatives of the present invention can be photocatalysts or thermal curing agents.

Known photocatalysts include two general types: onium salts and cationic organometallic salts, which are both useful in the invention.

Onium salt photocatalysts for cationic polymerizations include iodonium and sulfonium complex salts. Useful aromatic iodonium complex salts are of the general formula:

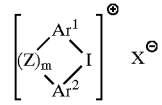

wherein

Ar$^1$ and Ar$^2$ can be the same or different and are aromatic groups having from 4 to about 20 carbon atoms, and are selected from the group consisting of phenyl, thienyl, furanyl, and pyrazolyl groups;

Z is selected from the group consisting of oxygen, sulfur, a carbon-carbon bond,

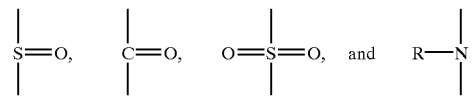

wherein R can be aryl (having from 6 to about 20 carbon atoms, such as phenyl) or acyl (having from 2 to about 20 carbon atoms, such as acetyl, or benzoyl), and

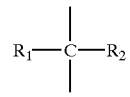

wherein R$_1$ and R$_2$ are selected from the group consisting of hydrogen, alkyl radicals having from 1 to about 4 carbon atoms, and alkenyl radicals having from 2 to about 4 carbon atoms;

m is zero or 1; and

X may have the formula DQ$_n$, wherein D is a metal from Groups IB to VIII or a metalloid from Groups IIIA to VA of the Periodic Chart of the Elements (Chemical Abstracts version), Q is a halogen atom, and n is an integer having a value of from 1 to 6. Preferably, the metals are copper, zinc, titanium, vanadium, chromium, magnesium, manganese, iron, cobalt, or nickel and the metalloids preferably are boron, aluminum, antimony, tin, arsenic and phosphorous. Preferably, the halogen, Q, is chlorine or fluorine. Illustrative of suitable anions are BF$_4^-$, PF$_6^-$, SbF$_6^-$, FeCl$_4^-$, SnCl$_5^-$, AsF$_6^-$, SbF$_5$OH$^-$, SbCl$_6^-$, SbF$_{5-2}^-$, AlF$_5^{-2}$, GaCl$_4^-$, InF$_4^-$, TiF$_6^{-2}$, ZrF$_6^-$, CF$_3$SO$_3^-$, and the like. Preferably, the anions are BF$_4^-$, PF$_6^-$, SbF$_6^-$, AsF$_6^-$, SbF$_5$OH$^-$, and SbCl$_6^-$. More preferably, the anions are SbF$_6^-$, AsF$_6^-$, and SbF$_5$OH$^-$.

Additional anions useful as the anionic portion of the catalysts and initiators of the present invention have been described in U.S. Pat. No. 5,554,664, incorporated herein by reference. The anions may be generally classified as fluorinated (including highly fluorinated and perfluorinated) tris alkyl- or arylsulfonyl methides and corresponding bis alkyl- or arylsulfonyl imides, as represented by Formulas X and Y, respectively, and hereinafter referred to as "methide" and "imide" anions, respectively, for brevity,

 (X)

 (Y)

wherein each $R_f$ is independently selected from the group consisting of highly fluorinated or perfluorinated alkyl or fluorinated aryl radicals. The methides and imides may also be cyclic, when a combination of any two $R_f$ groups are linked to form a bridge.

The $R_f$ alkyl chains may contain from 1–20 carbon atoms, with 1–12 carbon atoms preferred. The $R_f$ alkyl chains may be straight, branched, or cyclic and preferably are straight. Heteroatoms or radicals such as divalent oxygen, trivalent nitrogen or hexavalent sulfur may interrupt the skeletal chain, as is well recognized in the art. When $R_f$ is or contains a cyclic structure, such structure preferably has 5 or 6 ring members, 1 or 2 of which can be heteroatoms. The alkyl radical $R_f$ is also free of ethylenic or other carbon-carbon unsaturation: e.g., it is a saturated aliphatic, cycloaliphatic or heterocyclic radical. By "highly fluorinated" is meant that the degree of fluorination on the chain is sufficient to provide the chain with properties similar to those of a perfluorinated chain. More particularly, a highly fluorinated alkyl group will have more than half the total number of hydrogen atoms on the chain replaced with fluorine atoms. Although hydrogen atoms may remain on the chain, it is preferred that all hydrogen atoms be replaced with fluorine to form a perfluoroalkyl group, and that any hydrogen atoms beyond the at least half replaced with fluorine that are not replaced with fluorine be replaced with bromine and or chlorine. It is more preferred that at least two out of three hydrogens on the alkyl group be replaced with fluorine, still more preferred that at least three of four hydrogen atoms be replaced with fluorine and most preferred that all hydrogen atoms be replaced with fluorine to form a perfluorinated alkyl group.

The fluorinated aryl radicals of Formulas 2a and 2b may contain from 6 to 22 ring carbon atoms, preferably 6 ring carbon atoms, where at least one, and preferably at least two, ring carbon atoms of each aryl radical is substituted with a fluorine atom or a highly fluorinated or perfluorinated alkyl radical as defined above, e.g., $CF_3$.

Examples of anions useful in the practice of the present invention include: $(C_2F_5SO_2)_2N^-$, $(C_4F_9SO_2)_2N^-$, $(C_8F_{17}SO_2)_3C^-$, $(CF_3SO_2)_3C^-$, $(CF_3SO_2)_2N^-$, $(C_4F_9SO_2)_3C^-$, $(CF_3SO_2)_2(C_4F_9SO_2)C^-$, $(CF_3SO_2)(C_4F_9SO_2)N^-$, $[(CF_3)_2NC_2F_4SO_2]_2N^-$, $(CF_3)_2NC_2F_4SO_2C^-(SO_2CF_3)_2$, $(3,5\text{-bis}(CF_3)C_6H_3)SO_2N^-SO_2CF_3$,

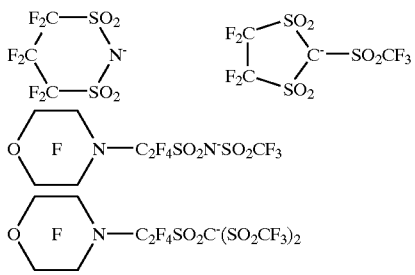

and the like. More preferred anions are those described by Formula X wherein $R_f$ is a perfluoroalkyl radical having 1–4 carbon atoms.

The $Ar_1$ and $Ar_2$ aromatic groups may optionally comprise one or more fused benzo rings (e.g., naphthyl, benzothienyl, dibenzothienyl, benzofuranyl, dibenzofuranyl, etc.). The aromatic groups may also be substituted, if desired, by one or more non-basic groups if they are essentially non-reactive with epoxide and hydroxyl functionalities.

Useful aromatic iodonium complex salts are described more fully in U.S. Pat. No. 4,256,828, which is incorporated herein by reference.

The aromatic iodonium complex salts useful in the invention are photosensitive only in the ultraviolet region of the spectrum. However, they can be sensitized to the near ultraviolet and the visible range of the spectrum by sensitizers for known photolyzable organic halogen compounds. Illustrative sensitizers include aromatic amines and colored aromatic polycyclic hydrocarbons, as described in U.S. Pat. No. 4,250,053, incorporated herein by reference.

Aromatic sulfonium complex salt catalysts suitable for use in the invention are of the general formula

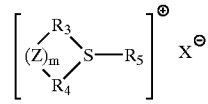

wherein $R_3$, $R_4$ and $R_5$ can be the same or different, provided that at least one of the groups is aromatic. These groups can be selected from the group consisting of aromatic moieties having from 4 to about 20 carbon atoms (e.g., substituted and unsubstituted phenyl, thienyl, and furanyl) and alkyl radicals having from 1 to about 20 carbon atoms. The term "alkyl" includes substituted alkyl radicals (e.g., substituents such as halogen, hydroxy, alkoxy, and aryl). Preferably, $R_3$, $R_4$ and $R_5$ are each aromatic; and Z, m and X are all as defined above with regard to the iodonium complex salts.

If $R_3$, $R_4$ or $R_5$ is an aromatic group, it may optionally have one or more fused benzo rings (e.g., naphthyl, benzothienyl, dibenzothienyl, benzofuranyl, dibenzofuranyl, etc.). The aromatic groups may also be substituted, if desired, by one or more non-basic groups if they are essentially non-reactive with epoxide and hydroxyl functionalities.

Triaryl-substituted salts such as triphenylsulfonium hexafluoroantimonate and p-(phenyl(thiophenyl)) diphenylsulfonium hexafluoroantimonate are preferred sulfonium salts. Triphenylsulfonium hexafluoroantimonate ($Ph_3SSbF_6$) is a most preferred catalyst. Useful sulfonium salts are described more fully in U.S. Pat. No. 5,256,828.

Aromatic sulfonium complex salts useful in the invention are photosensitive only in the ultraviolet region of the spectrum. However, they can be sensitized to the near ultraviolet and the visible range of the spectrum by a select group of sensitizers such as described in U.S. Pat. Nos. 4,256,828 and 4,250,053.

Suitable photoactivatable organometallic complex salts useful in the invention include those described in U.S. Pat.

Nos. 5,059,701, 5,191,101, and 5,252,694, each of which is incorporated herein by reference. Such salts of organometallic cations have the general formula:

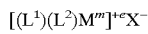

$$[(L^1)(L^2)M^m]^{+e}X^-$$

wherein $M^m$ represents a metal atom selected from elements of periodic groups IVB, VB, VIB, VIIB and VIII, preferably Cr, Mo, W, Mn, Re, Fe, and Co; $L^1$ represents none, one, or two ligands contributing π-electrons that can be the same or different ligand selected from the group consisting of substituted and unsubstituted acyclic and cyclic unsaturated compounds and groups and substituted and unsubstituted carbocyclic aromatic and heterocyclic aromatic compounds, each capable of contributing two to twelve π-electrons to the valence shell of the metal atom M. Preferably, $L^1$ is selected from the group consisting of substituted and unsubstituted $\eta^3$-allyl, $\eta^5$-cyclopentadienyl, $\eta^7$-cycloheptatrienyl compounds, and $\eta^6$-aromatic compounds selected from the group consisting of $\eta^6$-benzene and substituted $\eta^6$-benzene compounds (e.g., xylenes) and compounds having 2 to 4 fused rings, each capable of contributing 3 to 8 η-electrons to the valence shell of $M^m$; $L^2$ represents none or 1 to 3 ligands contributing an even number of σ-electrons that can be the same or different ligand selected from the group consisting of carbon monoxide, nitrosonium, triphenyl phosphine, triphenyl stibine and derivatives of phosphorous, arsenic and antimony, with the proviso that the total electronic charge contributed to $M^m$ by $L^1$ and $L^2$ results in a net residual positive charge of e to the complex; and e is an integer having a value of 1 or 2, the residual charge of the complex cation; X is a halogen-containing complex anion, as described above.

Certain thermally-activated curing agents for epoxy resins (e.g., compounds that effect curing and crosslinking of the epoxide by entering into a chemical reaction therewith) can be useful in the present invention. Preferably, such curing agents are thermally stable at temperatures at which mixing of the components takes place.

Suitable thermal curing agents include aliphatic and aromatic primary and secondary amines, e.g., di(4-aminophenyl)sulfone, di(4-aminophenyl)ether, and 2,2-bis-(4-aminophenyl)propane; aliphatic and aromatic tertiary amines, e.g., dimethylaminopropylamine and pyridine; quaternary ammonium salts, particularly pyridinium salts such as N-methyl-4-picolinium hexafluorophosphate; sulfoninum salts; fluorene diamines, such as those described in U.S. Pat. No. 4,684,678, incorporated herein by reference; boron trifluoride complexes such as $BF_3.Et_2O$ and $BF_3.H_2NC_2H_5OH$; imidazoles, such as methylimidazole; hydrazines, such as adipohydrazine; and guanidines, such as tetramethylguanidine and dicyandiamide (cyanoguanimide, commonly known as DiCy). It is to be understood that a careful choice among these curing agents must be made, since many of them would be unsuitable for use when high-melting PPE/HIPS materials are present, but that they may be useful in preparing mixtures of the invention that comprise low-melting thermoplastic materials and epoxy resins.

Additional high temperature thermal epoxy catalysts that can be particularly useful in the present invention include simple pyridinium, quinolinium, indolinium, benzothiazolium, alkyl, aryl and alkylaryl ammonium, sulfonium and phosphonium salts. These are effective initiators of the cationic polymerization of epoxies in the 250–350° C. temperature range. Because of these high exotherm temperatures, these catalysts are particularly suited to use with extrusion temperatures of 200° C. or greater. The compositions are stable in the extruder (i.e., they do not cure), eliminating problems that would be caused by crosslinking during this processing step. When finally cured, these compositions give surprisingly high overlap shear bond strengths. Useful ammonium and phosphonium salts are described in copending application U.S. Ser. No. 08/782,476, the teachings of which are incorporated herein by reference.

Catalysts useful in the invention can be present in an amount in the range of 0.01 to 10 weight percent, based on total epoxy resin composition, preferably 0.01 to 5 weight percent, and most preferably 0.5 to 3 weight percent. Catalysts may be added to the chosen epoxy in a powder form at temperatures up to about 150° C. No solvent is necessary for this operation. Incorporation time can range from 10–20 minutes depending on the epoxy/catalyst system. The epoxy/catalyst may then be pumped into the extruder for the melt processing step. Alternatively, the catalyst could be added directly into the thermoplastic/epoxy mixture during melt blending.

Various adjuvants can also be added to the compositions of the invention to alter the physical characteristics of the final material. Included among useful adjuvants are thixotropic agents such as fumed silica; pigments to enhance color tones such as ferric oxide, carbon black and titanium dioxide; fillers such as mica, silica, acicular wollastonite, calcium carbonate, magnesium sulfate and calcium sulfate; electrically and/or thermally conductive fillers, including metal particles, graphite, and metal-coated microspheres; chopped fibers and whiskers, including glass and carbon; clays such as bentonite; glass beads and bubbles; reinforcing materials such as unidirectional woven and nonwoven webs of organic and inorganic fibers such as polyester, polyimide, glass fibers, polyamides such as poly(p-phenylene terephthalamide), carbon fibers, and ceramic fibers. Amounts up to about 200 parts of adjuvant per 100 parts of PPE/PS/epoxy composition can be used.

The materials of the present invention can be prepared by batch or continuous processing.

Batch processing can be accomplished by adding solid thermoplastic, typically in pellet form, to a preheated mixer, such as a Brabender mixer (C. W. Brabender Instruments, Inc., South Hackensack, N.J.) equipped with, e.g., cam or sigma blades. After stirring for about 5 minutes, the thermoplastic is melted and a mixture of epoxy and curative for the epoxy is added with continued stirring. The resultant mixture is stirred to ensure complete mixing, at a duration and temperature below that which would substantially cure the epoxy component, and removed from the mixer while still molten. The mixture can then be molded, formed, shaped or pressed into a desired final configuration. The shaped object may then be irradiated and/or heated to cure the epoxy resin component. In particular, when a thin sheet or film is desired, the molten mass can be pressed in a heated flat-plate press, such as a Carver laboratory press (F. Carver, Inc., Wabash, Ind.).

Continuous processing can be accomplished using an extruder, e.g., a twin-screw extruder, equipped with a downstream port, a static mixer and an appropriate output orifice (film die, sheet die, fiber die, profile die, etc.) and a take-up or casting roll and wind-up roll(s), as appropriate. The casting roll may be cooled or maintained at a set temperature by thermostatic means. Solid thermoplastic is added to the input end of the extruder and processed using a temperature profile that is appropriate for the thermoplastic and which will not substantially cure the epoxy component, taking into account the duration of residence of the material in the extruder during processing. The epoxy component may be injected via gear or syringe pump. Take-up line speed is adjusted as appropriate for the output (sheet, fiber, etc.), typically from about 0.5 m/min to about 200 m/min.

In the cases where thermal curing of the epoxy is desirable immediately after extrusion, i.e., before the thermoplastic polymer cools and solidifies, further heating of the extrudate can take place directly at the die orifice or at a casting wheel. When it is desired that epoxy cure take place after the thermoplastic polymer cools and solidifies, the heat source (s) can be located just prior to the take-up roll. Finally, when it is desirable that no epoxy curing take place after extrusion such heating devices are absent.

In the case where photocuring of the epoxy is desirable immediately after extrusion, i.e., before the thermoplastic polymer cools and solidifies, UV irradiation of the heated extrudate can take place directly at the die orifice. Irradiation can be accomplished by any number of commercially-available UV sources, such as one or more Fusion Systems MD or H bulbs (available from Fusion UV Curing Systems, Rockville, D) or Sylvania BL 350 bulbs. When it is desired that epoxy cure take place after the thermoplastic polymer cools and solidifies, the light source(s) can be located just prior to the take-up roll. Finally, where it is desirable that no immediate epoxy curing take place after extrusion, the irradiation devices are absent and precautions may be taken to prevent UV exposure.

It is within the scope of the invention that a blended film, obtained from a sheet die, may be drawn either uniaxially or biaxially as it emerges from the die. Cure, as above, may take place before, during or after such drawing.

Where a film is used as an adhesive or coating, the material may be applied to its final substrate in an uncured state as a sheet and cured in situ by application of heat, pressure, UV light, or combinations thereof.

This invention is useful in the production of high performance adhesives and coatings, especially where improved peel strength is required. For example, this invention is useful in laminating films for electronic applications. The present invention is useful as an adhesive, as a protective covercoat, or as both.

Objects and advantages of this invention are further illustrated by the following examples, but the particular materials and amounts thereof recited in these examples, as well as other conditions and details, should not be construed to unduly limit this invention.

EXAMPLES

A variety of materials according to the present invention were made and are discussed in the following examples. Table A discloses the starting materials and weight proportions used in each example. Table A also discloses peel strength values for examples where that value was measured. Examples designated with a C, i.e., examples 1C, 13C, and 21C–30C, are comparative examples.

TABLE A

Composition and Peel Strength of Examples

| Ex # | PPE or PPE/HIPS blend | Epoxy (Epon 828 ™) | Catalyst | Functionalized Polystyrene (Dylark 332 ™) | Peel Strength on Kapton E ™ (ave. value) (N/m) |
|---|---|---|---|---|---|
| 1C | 100% EN185 | — | — | — | 18 |
| 5 | 95.6% EN185 | 4.4% | S | — | 300 |
| 6 | 91.8% EN185 | 8.2% | S | — | 330 |
| 7 | 91.2% EN185 | 8.8% | S | — | |
| 8 | 84.9% EN185 | 15.1% | S | — | 0.0 |
| 9 | 78.9% EN185 | 21.1% | S | — | 35 |
| 10 | 90% EN185 | — | — | 10% | |
| 11 | 86% EN185 | 4.4% | S | 9.6% | 320 |
| 12 | 82.3% EN185 | 8.5% | S | 9.2% | 610 |
| 13C | 100% SE1X | — | — | — | 18 |
| 14 | 94.9% SE1X | 5.1% | P | — | 260 |
| 15 | 90.6% SE1X | 9.4% | P | — | 350 |
| 16 | 83.9% SE1X | 16.1% | P | — | 420 |
| 17 | 94.9% SE1X | 5.1% | S | — | |
| 18 | 90.6% SE1X | 9.4% | S | — | 580 |
| 19 | 82.9% SE1X | 17.1% | S | — | 490 |
| 20 | 81.6% SE1X | 9.4% | S | 9.0% | |
| 21C | 100% HPP820 | — | — | — | 18 |
| 22C | 94.7% HPP820 | 5.3% | P | — | 53 |
| 23C | 90.2% HPP820 | 9.8% | P | — | 35 |
| 24C | 81.8% HPP820 | 18.2% | P | — | 88 |
| 25C | 75.0% HPP820 | 25.0% | P | — | 0.0 |
| 26C | 70.0% HPP820 | 30.0% | P | — | 0.0 |
| 27C | 65.0% HPP820 | 35.0% | P | — | 0.0 |
| 28C | 57.0% HPP820 | 43.0% | P | — | 0.0 |
| 29C | 94.7% HPP820 | 5.3% | S | — | |
| 30C | 87.8% HPP820 | 12.2% | S | — | |

Uncured materials were made according to the present invention by first blending the epoxy with the catalyst and injecting this mixture via a gear pump (Model HPB 4740, Zenith Metering pump, Parker Hannifin Co., Sanford, N.C.) into a conical twin screw extruder (Haake, Paramus, N.J.) where the epoxy was mixed with the thermoplastic PPO or PPO/HIPS blend at a constant screw rate of 100 rpm. The mixture was extruded as a film onto a casting wheel which was maintained at 20° C.

For compositions comprising Noryl EN185 and epoxy, the four extruder zones were each set at 200 ° C., with a pellet feed rate of 22.45 g/min, using a K-Tron™ feeder (K-Tron International, Pitman, N.J.). Typical processing temperatures were 182–209–206–204° C., from back (pellet-feed end) to front (die end) of the extruder. Pressure at the front (tip) of the extruder prior to epoxy introduction was 7.93 MPa. The amount of epoxy added was controlled by varying the speed of the metering pump from 10 to 30 rpm.

For compositions comprising Noryl SE1X and epoxy (except Examples 18 and 19), the extruder zones were set at 260–282–282–282° C., processing temperatures were 288–279–285–281° C. from back to front, and the pellet feed rate was 30 g/min. Initial pressure at the extruder tip was 7.6 MPa. Metering pump speed was varied from 8 to 30 rpm. For Examples 18 and 19, the extruder zones were set at 213–203–204–218° C. Processing temperatures, from back to front, were 203–224–217–218° C. for Example 18 and 195–213–208–218° C. for Example 19. The pellet feed rate was 24.2 g/min. Initial pressure at the extruder tip was 13.1 MPa for Example 18 and 8.6 MPa for Example 19. Metering pump speed was 13 rpm for Example 18 and 26 rpm for Example 19.

For compositions comprising Blendex HPP820 and epoxy, the extruder zones were set at 260–288–288–288° C., processing temperatures were 236–289–288–286° C., back to front, and the powder feed rate was 7.2 g/min. Initial pressure at the extruder tip was 10.9 MPa. Metering pump speed was varied from 2 to 9 rpm.

Two catalysts were used, designated P and S: N-methyl-4-picolinium hexafluorophosphate (P, described in copending application U.S. Ser. No. 08/782,476, pending, Example 6) and $Ar_3SSbF_6$ (S, where Ar can be phenyl, p-tolyl, or naphthyl; prepared as described in Example 2). N-methyl-4-picolinium hexafluorophosphate (P) can be activated thermally, whereas $Ar_3SSbF_6$ (S) can be activated either thermally or photolytically. The catalysts were added to the epoxy in powder form, without solvent, at 80° C. Incorporation time ranged from 10–20 minutes depending on the epoxy/catalyst system. The resulting mixture contained about 2% by weight catalyst. The weight of catalyst is included in the weight of the epoxy in Table A. The epoxy used was Epon™ 828 (diglycidyl ether of Bisphenol A), available from Shell Chemicals, Inc., Houston, Tex.

The PPE and PPE/HIPS blends used were Noryl™ EN185 and Noryl™ SE1X, which are blends of poly(2,6-dimethylphenylene oxide) (PPO) and high impact polystyrene (HIPS) (General Electric Plastics, Pittsfield, Mass.), and Blendex™ HPP820, which is PPO without admixed HIPS (General Electric Plastics). It is estimated that the EN185 is approximately 10% PPO and 90% HIPS and the SE1X is approximately 50% PPO and 50% HIPS. Note that the Tg and heat deflection temperature (HDT) of PPO/HIPS blends are determined by the relative amount of PPO to HIPS, with Tg and HDT increasing in proportion to PPO content. Noryl™ EN185, Noryl™ SE1X, and Blendex™ HPP820 have HDT's (at 1.8 MPa) of 82, 118, and 182° C., respectively.

In some examples, a functionalized polystyrene was mixed as a compatiblizer with the thermoplastic polymer blend prior to mixing with the epoxy to improve compatibility of the thermoplastic and epoxy components. The material used, a copolymer of styrene and maleic anhydride, is sold under the trade name Dylark™ 332 (Nova Chemicals, Sarnia, Ontario, Canada), which can be dry blended with the PPE and/or PPE/HIPS pellets prior to blending with epoxy. However, it was found that compatibility of the PPE and PPE/HIPS blends with epoxy was very good even without the added compatiblizer. No evidence of gross liquid-liquid separation occurred for any of the compositions of the examples.

Peel strength tests were performed on 0.05 mm thick Kapton E films, a polyimide substrate used in flexible circuitry. The adhesive films of the examples were laminated between two pieces of Kapton E film such that approximately 5.0 cm of Kapton E extended beyond the lamination, for peel testing. The adhesive films were typically 0.025 mm thick, ranging from 0.012 mm to 0.51 mm thick, after lamination. Films comprising the S catalyst were laminated at 2200° C., 3450 kPa for 50 min. and films comprising the P catalyst were laminated at 270° C., 3450 kPa for 50 min. Strips were cut from the laminates and 180° T-peels were performed on the test strips by fixing the two free Kapton E portions in the jaws of an Instron tensile testing machine (Model 1122, Instron Corp., Park Ridge, Ill.), equipped with a 5KN load cell, model 2511–317, and using a crosshead speed of 0.64 cm/min. The average peel strengths (5 trials) are presented in Table A. These results indicate that peel strength rises dramatically with addition of epoxy until an optimal level is reached. In addition, the data of Table A show that the PPE/PS/epoxy blends (Noryl™ EN185 and SE1X) exhibit more than 500% increase in peel strengths in comparison to PPE/epoxy blends (Noryl™ HPP820).

Overlap shear strength tests were performed essentially according to AS™ D1002-94 on three substrates: steel, aluminum and copper. Coupons of these materials measuring 11.43 cm×2.54 cm×3.2 mm were thoroughly cleaned with methyl ethyl ketone. Adhesive films of the invention, having thicknesses of from about 0.25 to about 0.75 mm were cut into squares measuring 2.54 cm on a side and placed between two coupons such that the area of overlap was 6.45 cm². The coupons and sample were held together with a small piece of high-temperature Teflon™ tape (Model 5490, 3M, St. Paul, Minn.) and were heated under pressure in a Carver press. The adhesives of examples 1C and 5 were cured at 220° C. and 3450 kPa for 50 minutes. The adhesives of examples 13C, 15, 16, 21C and 24 were cured at 270° C. and 3450 kPa for 50 minutes. Peak loads and strain to break were recorded from an Instron machine with a 44.5 KN load cell. The average values (5 repetitions) are presented in Table B. These results indicate that the shear strength of the compositions of the present invention was markedly improved in most cases over comparative compositions.

TABLE B

Shear Strength on Three Substrates

| | Steel | | | Aluminum | | | Copper | | |
|---|---|---|---|---|---|---|---|---|---|
| Ex # | Thickness (mm) | Load (MPa) | Extension (mm) | Thickness (mm) | Load (MPa) | Extension (mm) | Thickness (mm) | Load (MPa) | Extension (mm) |
| 1C | 0.127 | 7.9 ± 2.1 | 6.35 ± 0.76 | 0.076 | 15.7 ± 4.2 | 3.05 ± 0.00 | 0.076 | 10.4 ± 2.2 | 2.03 ± 0.25 |
| 5 | 0.076 | 5.0 ± 2.5 | 4.07 ± 1.52 | 0.025 | 21.4 ± 0.8 | 3.56 ± 0.00 | 0.127 | 25.6 ± 2.2 | 4.32 ± 1.27 |
| 13C | 0.076 | 6.6 ± 2.8 | 2.03 ± 0.25 | 0.05 | 10.4 ± 1.9 | 2.79 ± 0.25 | 0.102 | 6.7 ± 1.2 | 3.05 ± 0.51 |
| 15 | 0.051 | 7.2 ± 2.5 | 2.03 ± 00 | 0.102 | 16.3 ± 2.8 | 3.05 ± 0.25 | 0.203 | 5.7 ± 1.5 | 3.81 ± 0.51 |
| 16 | 0.051 | 9.7 ± 3.2 | 2.29 ± 0.51 | 0.076 | 17.4 ± 2.1 | 3.30 ± 0.25 | 0.203 | 8.6 ± 1.3 | 4.07 ± 1.02 |
| 21C | 0.076 | 1.9 ± 2.4 | 6.10 ± 0.76 | 0.076 | 1.6 ± 0.6 | 1.27 ± 0.25 | 0.102 | 2.1 ± 0.6 | 3.56 ± 0.25 |
| 24C | 0.076 | 6.6 ± 1.1 | 1.52 ± 0.25 | 0.076 | 5.9 ± 1.5 | 2.03 ± 0.25 | 0.152 | 5.0 ± 1.2 | 2.79 ± 0.76 |

Dynamic Mechanical Analysis (DMA) tensile testing was performed on cured and uncured materials, resulting in plots of storage modulus (a measure of the sample stiffness) versus temperature. Free-standing sample strips measuring 36 mm×6.4 mm×10 mm were used. The materials of the EN185-based examples were cured at 220° C. for 50 minutes and the materials of the SE1X and HPP820-based materials were cured at 270° C. for 50 minutes. A Seiko Instruments DMA 200 Rheometer (Seiko Instruments, Torrance, Calif.) equipped with a tensile sample feature was used. Separation between jaws was 20 mm. The temperature ramp was 2° C. per minute from −80 to 300° C., probed at 1 Hz.

A resulting plot is presented in FIG. 1. Curve A represents Example 15 (9.4% Epon 828, containing P-Cat, in Noryl SE1X) after cure. Curve B represents Example 15 before cure. Curve C represents a comparative example, Example 13C, which is 100% Noryl SE1X.

The DMA test results were used to determine glass transition temperatures, shown in Table C. In general, the glass transition temperature of uncured materials was seen to decrease as more epoxy was added to the base thermoplastic. However, the glass transition temperature of the PPE/PS increased after curing. For the samples based on PPE/HIPS blends, the glass transition temperature increased after cure to a level higher than that of the thermoplastic alone. As a result, the materials of the present invention based on PPE/HIPS blends are capable of maintaining their stiffness and other mechanical properties to higher temperatures.

TABLE C

Glass Transition Temperatures

| Ex # | $T_g$ (° C.) Uncured | $T_g$ (° C.) Cured |
|---|---|---|
| 1C | 115 | |
| 12 | 108 | 128 |
| 13C | 150 | |
| 15 | 144 | 170 |
| 16 | 132 | 169 |
| 17 | 146 | |
| 19 | 117 | |
| 20 | 142 | |
| 21C | 221 | |
| 24C | 189 | 213 |
| 29C | 208 | |

Various modifications and alterations of this invention will become apparent to those skilled in the art without departing from the scope and principles of this invention, and it should be understood that this invention is not to be unduly limited to the illustrative embodiments set forth hereinabove. All publications and patents are herein incorporated by reference to the same extent as if each individual publication or patent was specifically and individually indicated to be incorporated by reference.

We claim:

1. A method of making a curable melt blended composition comprising the step of melt blending:
   a) 60 to 99.9 weight percent of a thermoplastic polymer comprising
      1) 1–99 weight percent of polyphenylene ether (PPE) polymer, and
      2) 1–99 weight percent of a polystyrene (PS) polymer; and
   b) 0.1 to 40 weight percent of an uncured epoxy component comprising
      1) a curable epoxy, and
      2) an effective amount of a curing agent for said curable epoxy;
   wherein the step of melt blending occurs at a temperature greater than 150° C. and wherein the epoxy component of the resulting composition is substantially uncured.

2. The method of claim 1, wherein said thermoplastic polymer additionally comprises greater than 0 weight percent to about 25 weight percent of a compatiblizer.

3. The method of claim 1, wherein said curable melt blended composition comprises 70–99.9 weight percent of said thermoplastic polymer.

4. The method of claim 1, wherein said polystyrene polymer is a high impact polystyrene (HIPS) polymer.

5. The method of claim 4, wherein said thermoplastic polymer comprises 10–90 weight percent of said high impact polystyrene (HIPS) polymer.

6. The method of claim 1, wherein said curing agent is an epoxy cure catalyst.

7. The method of claim 1, wherein said melt blending step is achieved without addition of solvent.

8. The method of claim 1, wherein said curable melt blended composition is an adhesive.

9. The method of claim 8, wherein said curable melt blended composition is an adhesive for electronics applications.

* * * * *

UNITED STATES PATENT AND TRADEMARK OFFICE
CERTIFICATE OF CORRECTION

PATENT NO. : 6,518,362 B1
DATED : February 11, 2003
INVENTOR(S) : Clough, Robert S.

It is certified that error appears in the above-identified patent and that said Letters Patent is hereby corrected as shown below:

Title page,
Item [57], ABSTRACT,
Line 2, "compatiblizer" should read -- compatibilizer --

Column 2,
Line 8, "compatiblizers" should read -- compatibilizers --

Column 3,
Line 20, "EMBODIMENT" should read -- EMBODIMENTS --

Column 4,
Lines 12 and 22, "Pitsfield" should read -- Pittsfield --
Line 34, "compatiblizer" should read -- compatibilizer --

Column 5,
Line 36, "methylcycylohexylmethyl" should read -- methylcyclohexylmethyl --

Column 6,
Line 61, "$SbF_{5-2}$" should read -- $SbF_5^{-2}$ --

Column 9,
Line 45, "sulfoninum" should read -- sulfonium --
Line 49, "methylimidiazole" should read -- methylimidazole --

Column 11,
Line 28, "MD or H bulbs" should red -- D or H bulbs --
Line 29, "Rockville, D" should read -- Rockville, MD --

Column 13,
Lines 35 and 61, "compatiblizer" should read -- compatibilizer --
Line 55, "coplymer" should read -- copolymer --

UNITED STATES PATENT AND TRADEMARK OFFICE
CERTIFICATE OF CORRECTION

PATENT NO. : 6,518,362 B1
DATED : February 11, 2003
INVENTOR(S) : Clough, Robert S.

It is certified that error appears in the above-identified patent and that said Letters Patent is hereby corrected as shown below:

Column 14,
Line 5, "2200°" should read -- 220° --
Line 19, "AS$^{tm}$" should read -- ASTM --

Column 16,
Line 21, "compatiblizer" should read -- compatibilizer --

Signed and Sealed this

Sixth Day of July, 2004

JON W. DUDAS
*Acting Director of the United States Patent and Trademark Office*